United States Patent [19]

Kanazawa et al.

[11] Patent Number: 4,747,909
[45] Date of Patent: May 31, 1988

[54] METHOD FOR MANUFACTURING A PERPENDICULAR SIDEWALLED METAL LAYER ON A SUBSTRATE

[75] Inventors: Kunihiko Kanazawa, Toyonaka; Masaru Kazumura, Takatsuki, both of Japan

[73] Assignee: Matsushita Electronics Corporation, Kadoma, Japan

[21] Appl. No.: 853,762

[22] Filed: Apr. 18, 1986

[30] Foreign Application Priority Data

Apr. 19, 1985 [JP] Japan .................................. 60-84913

[51] Int. Cl.⁴ ...................... H01L 21/312; C25D 5/02
[52] U.S. Cl. .................................... 156/653; 156/652; 156/661.1; 430/314; 430/317
[58] Field of Search ............... 156/643, 656, 655, 644, 156/659.1, 646, 657, 662, 653, 652, 661.1; 427/88; 430/317, 314

[56] References Cited

U.S. PATENT DOCUMENTS

| | | | |
|---|---|---|---|
| 4,029,562 | 6/1977 | Feng et al. | 156/656 X |
| 4,428,796 | 1/1984 | Milgram | 156/655 X |
| 4,498,952 | 2/1985 | Christensen | 156/643 |

OTHER PUBLICATIONS

Powell et al, "Vapor Deposition", John Wiley & Sons Inc., 1966, pp. 298-299.

*Primary Examiner*—Kenneth Schor
*Assistant Examiner*—Thi Dang
*Attorney, Agent, or Firm*—Cushman, Darby & Cushman

[57] ABSTRACT

A thick resist layer is formed on a thin metal film and the resist layer is dry-etched by using an $SiO_2$ mask formed selectively on the resist layer, and a thick wiring metal layer is formed by plating method with using the dry-etched resist layer, which has perpendicular side walls as a mask, thereby to form a low resistance and fine-patterned wiring metal layer.

8 Claims, 3 Drawing Sheets

METHOD FOR MANUFACTURING A PERPENDICULAR SIDEWALLED METAL LAYER ON A SUBSTRATE

FIELD OF THE INVENTION AND RELATED ART STATEMENT

1. Field of the Invention

The present invention is related to a method for making a mask and particularly related to a method for making a mask having perpendicular side walls.

Further the present invention is related to a method for making a patterned metal layer by using the above-mentioned mask making method, and particularly related to a method for making a low resistance metal wiring by using the same mask making method.

2. Description of the Related Art

Recently, technology to make semiconductor devices for high frequency and high speed has been developed. The GaAs-FET is considered to be an FET having excellent high frequency characteristics. Particularly, a GaAs-MES-FET integrated circuit is developed for providing multifunctions, high stability and high gain. However, further development of such highly integrated devices in which the noise characteristics are superior under 10 GHz or higher frequency is strongly required, responding to the beginning of the satellite broadcasting.

Now, the reduction of the wiring resistance is a necessary condition to obtain such low noise and high integration.

For instance, in a GaAs monolithic microwave integrated circuit (GaAs MMIC), the reduction of the wiring resistance is designed as mentioned below.

A spiral inductance as shown in FIG. 3(A), a coupler as shown in FIG. 3(B) and an interdigital capacitor (a comb type capacitor) as shown in FIG. 3(C) are fundamental elements of the GaAs MMIC. Hole 3 is a contact window. For the spiral inductance and the interdigital capacitor, the narrower the line width of the wiring 2 and the space between lines of the wiring 2 are, the larger the inductance or the capacitance is. Thereby, production of the elements becomes possible in a small area. Wiring is provided on another layer not indicated herein. However, the narrower the line width and the space between lines are, the larger the wiring resistance is and the more inferior the noise characteristic is and further the lower the gain is and still further the more inferior the high frequency characteristic is.

Therefore, plating on the wiring is executed to make the thickness of the wiring large, hence, to reduce the wiring resistance. And, 2 to 3 μm thick plating on the wiring 2 is executed by using a 2 to 3 μm thick resist as a mask.

However, the conventional art could not make a precise plating pattern on the wiring by using a thick photoresist film. That is, in the conventional making of thick photoresist, the mask of the resist is formed by light exposure and subsequent development, and therefore, the vertical cross-sectional shape of the mask of the photoresist becomes a trapezoidal configuration in which the upper side is narrower than the lower side. Therefore, when the plating is executed by using the above-mentioned mask, the shape of the plated metal layer becomes trapezoidal, such that the upper side is wider than the lower side. Accordingly, the space configuration between the plated metal layers neighboring becomes trapezoidal, such that the upper side is narrower than the lower side. Therefore, the required precise dimensions of the wiring plating are not obtainable. Particularly, when the line width or the space between the lines is on the order of 2 to 3 μm or less. Therefore the conventional method has such problem that accurate high frequency inductance, capacitance, or coupling is not obtainable.

SUMMARY OF THE INVENTION

The present invention provides a method to resolve the above-mentioned problems of the conventional method.

The method for making a patterned metal layer in accordance with the present invention comprises the steps of:

forming a photoresist layer made of an organic material on a substrate, forming an inorganic film on the photoresist layer, selectively removing the inorganic film thereby retaining a predetermined pattern, selectively dry-etching the photoresist layer by using the inorganic film of the predetermined pattern as a first mask, thereby to make a second mask having perpendicular side walls, forming a metal layer by using the second mask of the patterned photoresist layer, and removing the first mask and the second mask, thereby to make a patterned metal layer.

While the novel features of the invention are set forth with particularlity in the appended claims, the invention, both as to organization and content, will be better understood and appreciated, along with other objects and features thereof, from the following detailed description taken in conjunction with the drawings.

DESCRIPTION OF THE PREFERRED EMBODIMENTS

One embodiment of the present invention is described as follows referring to FIG. 1, FIG. 2 and FIG. 3.

Figure 1:
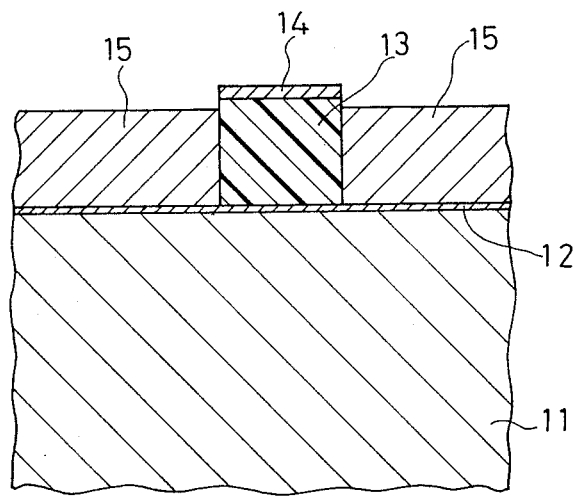
FIG. 1 is a cross-sectional view showing a semiconductor in a certain step of the method for making a patterned metal layer of the present invention.

FIG. 1 is a cross-sectional view showing the semiconductor in a certain step of the method for making the patterned metal layer of the present invention.

In FIG. 1, a thin conductive film 12, for instance, a metal film such as Ni or Au or laminated layer of Cr (lower) and Au (upper) is formed on a semiconductor substrate or an insulation substrate 11. A photoresist layer 13 made of organic material, for example, photoresist, is formed on a part of the surface of the conductive film 12. A thin inorganic film 14 is formed on the photoresist layer 13. A plated metal layer 15 is formed on a remaining part of the surface of the conductive film 12. The side wall of the photoresist layer 13 is perpendicular against the semiconductor substrate 11 and the conductive film 12. Therefore, the wiring, particularly, the plated metal layer 15 is formed with its side wall perpendicular against the semiconductor substrate 11 and the conductive film 12.

The process steps of the method of the present invention are mentioned below.

Figure 2A:
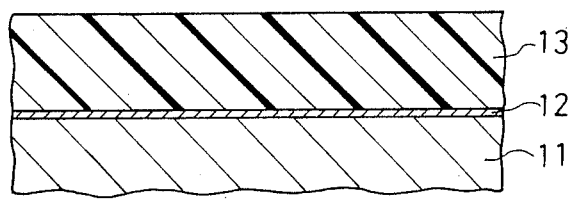
FIG. 2(A), FIG. 2(B), FIG. 2(C), FIG. 2(D) and FIG. 2(E) are cross-sectional views showing a succession of steps in the flow of an embodiment of the method for making a patterned metal layer of the present invention.
Figure 3:
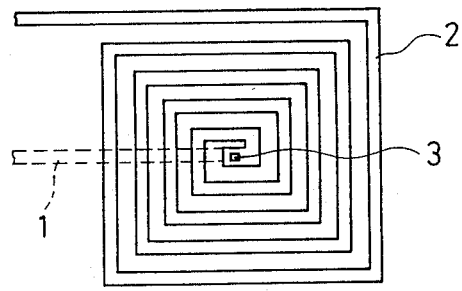
FIG. 3(A) is the plan view showing the wiring of a conventional spiral inductance.
FIG. 3(B) is the plan view showing the wiring of a conventional coupler.
FIG. 3(C) is the plan view showing the wiring of a conventional interdigital capacitor.
Figure 3:
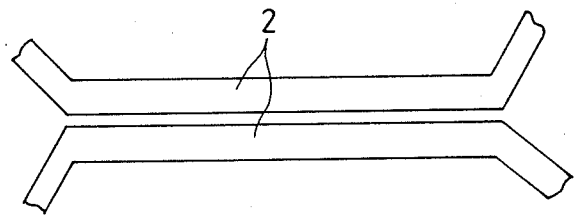
Figure 3:
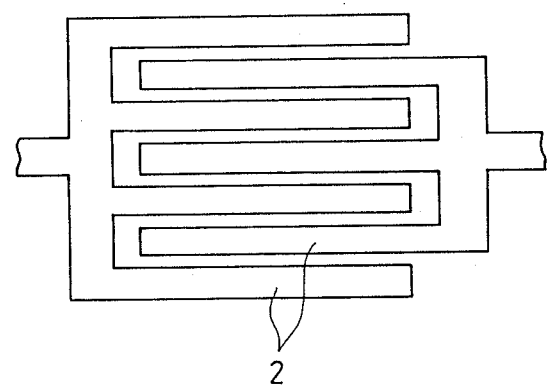

First, a photoresist layer 13 of 3 to 5 μm thick, is coated on the whole surface of the conductive film 12, which is itself 500 to 1000 Å thick on the semiconductor substrate 11, as shown in FIG. 2(A).

Figure 2B:
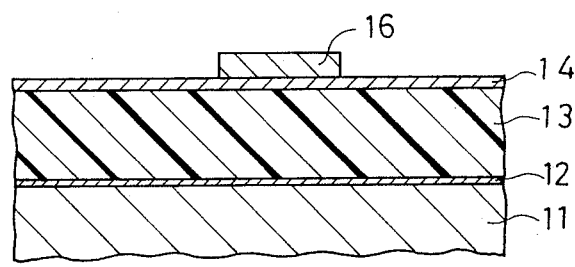
Figure 2C:
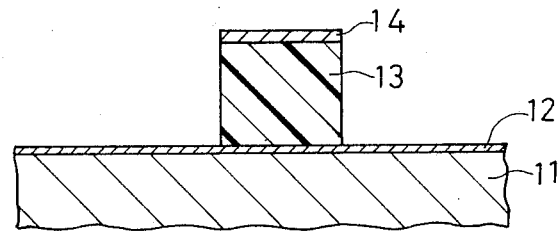

A inorganic film 14 is formed to a thickness of 1000 to 2000 Å by means of a coating of a $SiO_2$ substance or by evaporating aluminium or gold on the resist layer 13 as shown in FIG. 2(B).

A conventional thin photoresist layer 16 of about 1 μm thickness for use in creating a fine pattern is coated on the inorganic film 14. Further, the conventional thin photoresist layer 16 is exposed and developed, thereby to form a required patterned thin photoresist layer 16. This patterned thin photoresist layer 16 has a perpendicular side wall, since the thickness is so small, even though using the exposure and development. Such a patterned thin photoresist layer 16 can be formed with an accuracy of within an error of only 0.1 μm or less.

The inorganic film 14 is etched by a chemical etching method (wet etching method) or dry etching method with using the patterned thin photoresist layer 16.

The patterned thin photoresist layer 13 is etched by a dry etching method, for instance, a reactive ion etching (RIE) method with using the inorganic film 14 as a mask. As a result of use of such a dry etching method, the side wall of the organic material photoresist layer 13 can be made perpendicular against the semiconductor substrate 11 and the conductive film 12, and thus a mask having a perpendicular side wall is made. The mask is superior for controlling the forming of the wiring metal layer.

The wiring metal layer 15 is formed by a plating method, a sputtering method or an evaporation method, with the perpendicular side wall mask of the resist layer 13 and the inorganic film 14.

In case of utilizing a sputtering method or an evaporation method, for forming the thick wiring metal layer 15, the wiring metal layer 15 is formed not only on the inorganic film 14 and the conductive film 12 but also on the side wall of the resist layer 13.

Figure 2D:
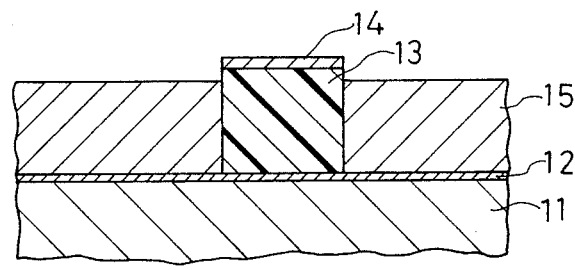

In case of utilizing a plating method for forming the thick wiring metal layer 15, the 2 to 4 μm thick wiring metal layer can be formed, as shown in FIG. 2(D), only on the conductive film 12 but not on the inorganic film 14 or on the side wall of the photoresist layer 13. As the plating method, for example, an electrolytic plating method or an electroless plating method can be used. The electrolytic plating method uses the conductive film 12 as one electrode, to form the wiring metal layer 15 uniformly on the surface except under the resist layer 13, of the conductive film 12. The thickness of the wiring metal layer 15 can be formed extremely precisely by controlling the voltage or the current and time in the electrolytic plating method.

In the electroless plating method, the inorganic film 14 can be an $SiO_2$ layer and the kind of electrolyte is selected such that the wiring metal layer is formed only on the conductive film 12; for instance; an alkali Au plating liquid including mainly calcium hydroxide can be used.

Gold plating as the metal plating is used when the wiring metal resistance should be very small.

After forming the wiring metal layer, the photoresist layer 13 and the inorganic layer 14 are removed by using a known lift off method.

Figure 2E:
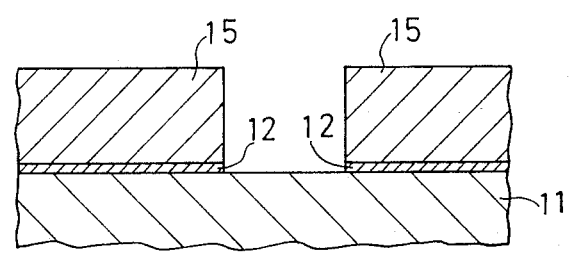

Finally, the lowest exposed conductive film 12 is removed by etching as shown in FIG. 2(E), thereby to complete the 2 to 4 μm thick wiring metal layer pattern within a 0.2 to 0.3 μm error. When the pressure of the chamber in the reactive ion etching process is precisely controlled, the error can be within 0.1 to 0.2 μm. A selectively etching liquid is preferable to be used for the last etching.

According to the above-mentioned method, the wiring layer of the spiral inductance as shown in FIG. 3(A), the wiring layer of the coupler as shown in FIG. 3(B) or the wiring layer of the interdigital capacitor as shown in FIG. 3(C) can be made with desirable low resistance, and 2 and 4 μm thick wiring metal can be made with at most 0.1 to 0.2 μm error.

While specific embodiments of the invention have been illustrated and described herein, it is realized that modifications and changes can be made by those skilled in the art. It is therefore to be understood that the appended claims are intended to cover all modifications and changes as fall within the true spirit and scope of the invention.

We claim:

1. A method for manufacturing a perpendicular sidewalled metal layer on a substrate, comprising:
    (a) forming an electrically conductive layer on a substrate;
    (b) forming a first photoresist layer made of an organic material on said electrically conductive layer;
    (c) forming an inorganic film on said photoresist layer;
    (d) forming a second photoresist layer which is thinner than said first photoresist layer on a first region of said inorganic film, while leaving an adjoining second region of said inorganic film uncovered by said thinner second photoresist layer;
    (e) selectively etching away said inorganic film in said adjoining second region by one of wet-etching and dry-etching sufficiently to thereby expose said first photoresist layer in a pattern matching that of said adjoining second region;
    (f) selectively dry-etching away said first photoresist layer in said pattern, using said inorganic film remaining in place in the first region as a mask, to thereby expose said conductive film in said pattern and create, from said first photoresist layer remaining in place in said first region, a second mask having sidewalls which are substantially perpendicular to said conductive film;
    (g) electrolytically plating a metal layer onto said conductive layer using said conductive layer as an electrode, thereby building said metal layer on said conductive layer in said pattern with said sidewalls of the second mask defining sidewalls of said metal layer, said metal layer being less thick at said sidewalls thereof than is said first photoresist layer at said sidewalls thereof wherein the height of said metal layer on said conductive layer determines the thickness of said metal layer and said metal layer is not plated onto said first photoresist layer; and (h) removing said first photoresist layer and said electrically conductive layer from said substrate in said first region.

2. The method of claim 1, wherein:
said electrically conductive layer is 500–1000 Å in thickness;
said first photoresist layer is 3–5 μm in thickness;
said inorganic film is 1000–2000 Å in thickness;
said thinner second photoresist layer is about 1 μm in thickness; and
said metal layer together with said electrically conductive layer is 2–4 μm in thickness.

3. The method of claim 2, wherein:
said pattern is selected to provide said metal layer together with said electrically conductive layer as a wiring layer of a spiral inductance.

4. The method of claim 2, wherein:
said pattern is selected to provide said metal layer together with said electrically conductive layer as a wiring layer of a coupler.

5. The method of claim 2, wherein:
said pattern is selected to provide said metal layer toogether with said electrically conductive layer as a wiring layer of a interdigital capacitor.

6. The method of claim 2, wherein:
said inorganic film is made of a constituent of the group consisting of $SiO_2$, Al and Au.

7. The method of claim 2, wherein:
said metal layer is made of Au.

8. A method for making a patterned metal layer comprising the steps of:
forming a conductive film on a substrate,
forming a resist layer made of an organic material on said conductive film,
forming an inorganic film on said resist layer,
selectively removing said inorganic film by using a thin photoresist layer thereby retaining a predetermined pattern,
selectively dry-etching said resist layer by using said inorganic film of said predetermined pattern as a first mask, thereby to make a second mask having perpendicular side walls, and
forming a metal layer on said conductive layer using said second mask of said patterned resist layer by an electrolytic plating method in which said conductive film is used as one electrode, thereby building said metal layer on said conductive layer in said pattern with said sidewalls of the second mask defining sidewalls of said metal layer, said metal layer being less thick at said sidewalls thereof than is said resist layer at said sidewalls thereof, wherein the height of said metal layer on said conductive layer determines the thickness of said metal layer and said metal layer is not plated onto said resist layer.

* * * * *